US006758950B2

(12) United States Patent
Krauss et al.

(10) Patent No.: US 6,758,950 B2
(45) Date of Patent: Jul. 6, 2004

(54) CONTROLLED MAGNETRON SHAPE FOR UNIFORMLY SPUTTERED THIN FILM

(75) Inventors: Peter R. Krauss, Bloomington, MN (US); Shaun E. McKinlay, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/116,261

(22) Filed: Apr. 4, 2002

(65) Prior Publication Data

US 2003/0132106 A1 Jul. 17, 2003

Related U.S. Application Data

(60) Provisional application No. 60/348,694, filed on Jan. 14, 2002.

(51) Int. Cl.[7] .............................................. C23C 14/35
(52) U.S. Cl. .............................. 204/192.2; 204/192.12; 204/192.15; 204/298.17; 204/298.13; 204/298.2
(58) Field of Search ................... 204/192.12, 192.15, 204/192.2, 298.11, 298.17, 298.19, 298.2, 298.13

(56) References Cited

U.S. PATENT DOCUMENTS

| | | | |
|---|---|---|---|
| 4,444,643 A | * | 4/1984 | Garrett ..................... 204/298.2 |
| 5,248,402 A | | 9/1993 | Ballentine et al. .......... 204/298 |
| 5,314,597 A | * | 5/1994 | Harra ..................... 204/192.13 |
| 5,650,052 A | * | 7/1997 | Edelstein et al. ...... 204/192.12 |
| 5,830,327 A | | 11/1998 | Kolenkow ............. 204/192.12 |
| 6,132,565 A | | 10/2000 | Lin ........................ 204/192.15 |
| 6,183,614 B1 | | 2/2001 | Fu ........................... 204/298.2 |
| 6,258,217 B1 | | 7/2001 | Richards et al. ....... 204/192.12 |
| 2001/0006444 A1 | * | 7/2001 | Hayakawa et al. ...... 360/324.1 |

OTHER PUBLICATIONS

"A3.0 Sputtering: Introduction and General Discussion", by S. Shah, *Handbook of Thin Film Process Technology*, pp. A3.0:18, 1996.

"Microsystem Technology and Microrobotics" by S. Fatikow et al., *Techniques of Microsystem Technology*, pp. 48–49, 1997.

\* cited by examiner

*Primary Examiner*—Steven VerSteeg
(74) *Attorney, Agent, or Firm*—Westman, Champlin & Kelly

(57) ABSTRACT

A sputtering chamber includes a sputtering target with a front target surface, and a magnetron behind the sputtering target. The magnetron provides a magnetic field at the front target surface along a generally round path that includes a path indentation. A shutter is spaced apart from the front target surface by a shutter spacing. A substrate is aligned with a central region in front of the front target surface and spaced apart from the front target surface by a selected spacing that is greater than the shutter spacing. The central region has a diameter defined by a uniformly sputtered thickness of deposited layers on the substrate. The path indentation is set to a path indentation depth that adjusts the selected spacing to maximize the diameter.

17 Claims, 8 Drawing Sheets

CONTROLLED MAGNETRON SHAPE FOR UNIFORMLY SPUTTERED THIN FILM

CROSS-REFERENCE TO RELATED APPLICATION

This application claims priority benefits from U.S. Provisional Application 60/348,694 titled "Optimizing Magnetron Shape for Thin Film Deposition Uniformity," filed Jan. 14, 2002.

FIELD OF THE INVENTION

The present invention relates generally to methods and apparatus for magnetron sputtering of thin films. In particular, the present invention relates to thin films in heads for use in a magnetic storage drive.

BACKGROUND OF THE INVENTION

A read/write head in a disc drive typically includes a magnetoresistive (MR) read transducer that is deposited between non-magnetic layers and magnetic shield layers. The magnetoresistive read transducer typically includes a magnetoresistor, electrical contacts and a stack of various layers that have different shapes and compositions depending on the design of the magnetoresistive (MR) read transducer. There is a need to control thickness of the various layers to optimize performance of the read transducer.

One type of magnetoresistive read transducer is a spin valve transducer that include a giant magnetoresistor (GMR). A spin valve transducer typically includes a free layer comprising nickel and iron (NiFe), a spacer layer comprising copper (Cu), a pinned layer comprising cobalt (Co), and an exchange layer comprising iron and manganese (FeMn).

Magnetron sputtering can be used to form layers in a magnetoresistive transducer, in particular, the spacer layer comprising copper in the spin valve transducer. A transducer substrate is arranged in a sputtering chamber generally aligned with a "racetrack" pattern defined by a region where the magnetron's magnetic field intersects with an electric field in front of a sputtering target.

The thickness of resulting thin films on the transducer substrate is most uniform only in a relatively small diameter region, compared to the diameter of the racetrack, and centered along the rotation axis of the magnetron. When a new, uneroded target is used, variations of uniformity of the sputtered film thickness on the order of 6–8% are seen across the wafer substrate or wafer. Better uniformity of the sputtered film thickness is needed, and productions yields are low. The uniformity deteriorates rapidly as the target wears, and targets are replaced frequently in an effort to maintain adequate production yields.

A method and apparatus are needed to improve magnetron-sputtered film uniformity in thin film transducers.

SUMMARY OF THE INVENTION

Disclosed is a magnetron sputtering apparatus and a method of manufacturing arrays of magnetoresistive transducers by magnetron sputtering.

A sputtering chamber includes a sputtering target with a front target surface, and a magnetron behind the sputtering target. The magnetron provides a magnetic field at the front target surface along a generally round path that includes a path indentation.

A shutter is spaced apart from the front target surface by a shutter spacing. A substrate is aligned in front of the front target surface and spaced apart from the front target surface by a selected spacing that is greater than the shutter spacing.

A central region on the substrate has a diameter defined by a uniformly sputtered thickness of deposited layers on the substrate. The path indentation is set to a path indentation depth that adjusts the selected spacing to maximize the diameter.

These and various other features as well as advantages that characterize the present invention will be apparent upon reading of the following detailed description and review of the associated drawings.

DETAILED DESCRIPTION OF ILLUSTRATIVE EMBODIMENTS

In the embodiments described below, a method and apparatus for magnetron sputtering are disclosed. Layers of read transducers can be sputtered with improved uniformity of thickness across a wafer that includes an array of magnetoresistors. The improved uniformity of thickness improves manufacturing yield. The spacing between the sputter target and the wafer is adjusted and the arrangement of selected magnets on the magnetron is shifted slightly to give a surprising increase in thin film layer thickness in a production environment.

With the illustrated embodiments, problems with non-uniform thickness of a copper spacing layer in a spin valve transducer are avoided, and the performance of a magnetoresistive read transducer is improved.

Figure 1:
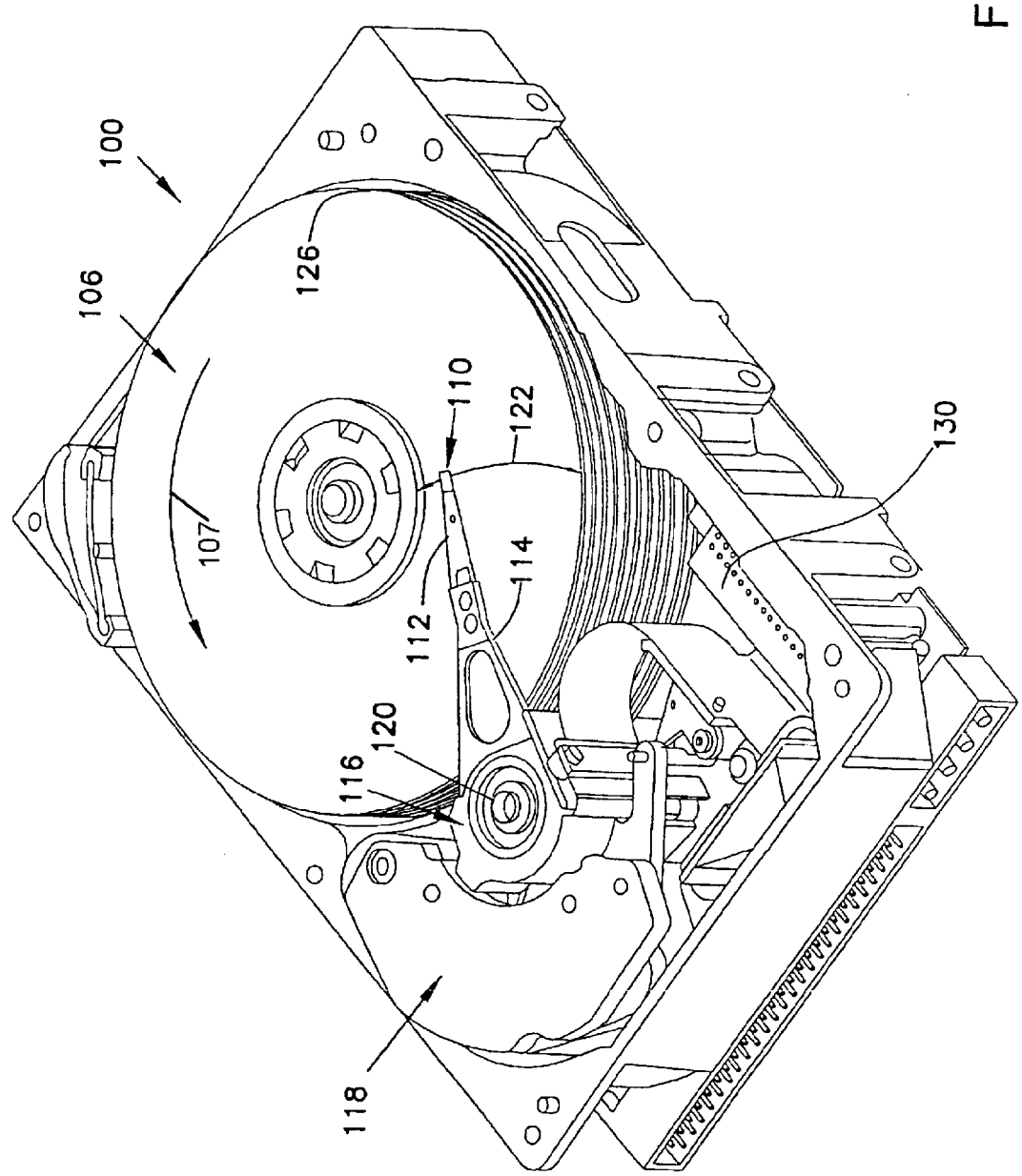
FIG. 1 illustrates a disc drive storage device.

FIG. 1 illustrates an embodiment of a disc drive storage device 100. Disc drive 100 includes a disc pack 126 having storage surfaces 106 that are illustratively layers of material (such as magnetic material or optically readable material). The disc pack 126 includes a stack of multiple discs each accessible by a read/write assembly 112 that includes a slider 110 that includes a read/write head. A spindle motor drives rotation of the discs in disc pack 126 in a direction such as that shown by arrow 107. As discs are rotated, read/write assembly 112 accesses different rotational locations on the storage surfaces 106 in disc pack 126. Read/write assembly 112 is actuated for radial movement relative to the disc surfaces 106, such as in a direction indicated by arrow 122, in order to access different tracks (or radial positions) on the disc surfaces 106. Such actuation of read/write assembly 112 is illustratively provided by a servo system that includes a voice coil motor (VCM) 118. Voice coil motor 118 includes a rotor 116 that pivots on axis 120. VCM 118 also illustratively includes an arm 114 that supports the read/write head assembly 112.

Disc drive 100 illustratively includes control circuitry 130 for controlling operation of disc drive 100 and for transferring data in and out of the disc drive 100.

Figure 2:
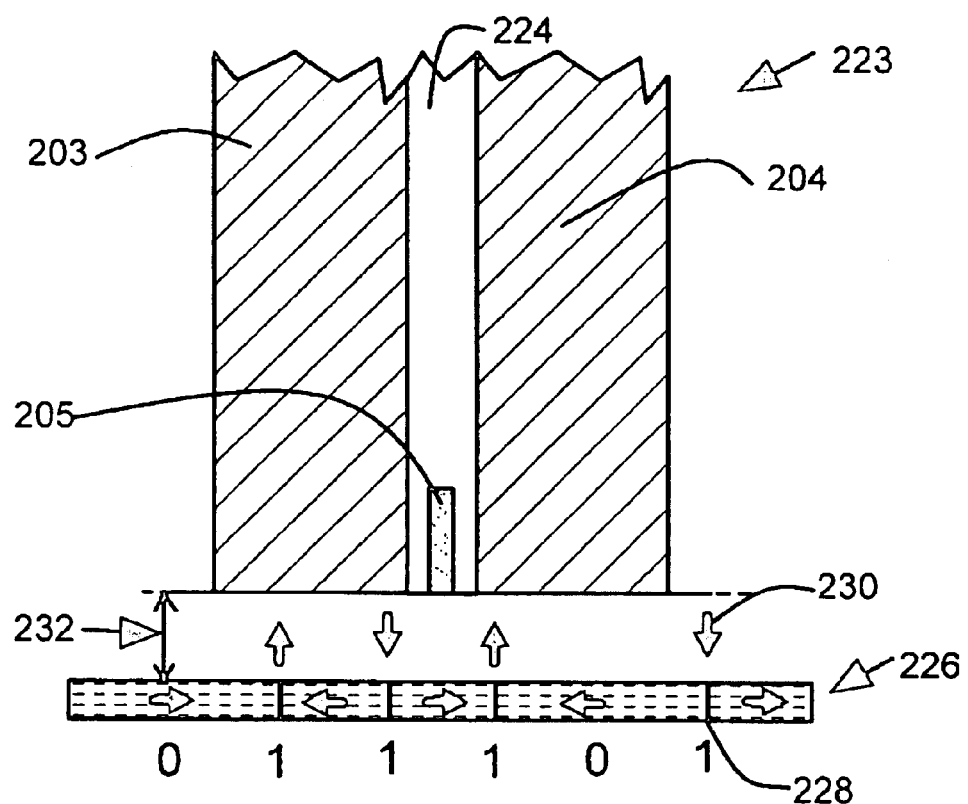
FIG. 2 schematically illustrates an enlarged partial cross sectional view of a head flying over a magnetic layer of a disc.

FIG. 2 illustrates an enlarged partial cross sectional view of a head 223 such as the head 110 and a magnetic layer 226 of a disc such as the discs 126 illustrated in FIG. 1. In the head 223, a bottom shield 203 and a shared shield 204 are placed on opposite sides of a magnetoresistive read transducer 205 and provide magnetic shielding for the read transducer 205. A nonmagnetic layer or layers 224 magnetically isolate the read transducer 205 from the shields 203, 204.

Read transducer 205 senses external magnetic field components 230 emanating from a track in the magnetic layer 226 as the track moves past the head 223 at a constant speed. The magnetic field components 230 are present over each transition 228 in the magnetic layer 226. Each transition 228 is a line or wall along which the direction of the magnetization in magnetic layer 226 reverses or changes direction. Each magnetic field component 226 is sensed as it passes between the shielding layers 203, 204. The shielding layers 203, 204 shield the read transducer 205 from neighboring external magnetic field components 230. During operation of a disc drive, the head 223 remains spaced away from the magnetic layer 226 by a spacing 232. The spacing 232 includes an air bearing protective layer and any protective layer that is deposited over the magnetic layer 226.

Digitized information is stored on the magnetic layer 226 in the form of magnetic transitions 228. Each bit is represented by the presence (1) or absence (0) of a transition in the media. When transitions 230 are sensed, external electronic circuitry connected to the read transducer 205 interprets the transition 230 as one logical state (a one (1) for example), and interprets the absence of a transition 230 at a particular time as another logical state (a zero, for example). Magnetoresistive read transducer 205 can be arranged with shields using many different arrangements and processes, some of which are illustrated below.

Figure 3:
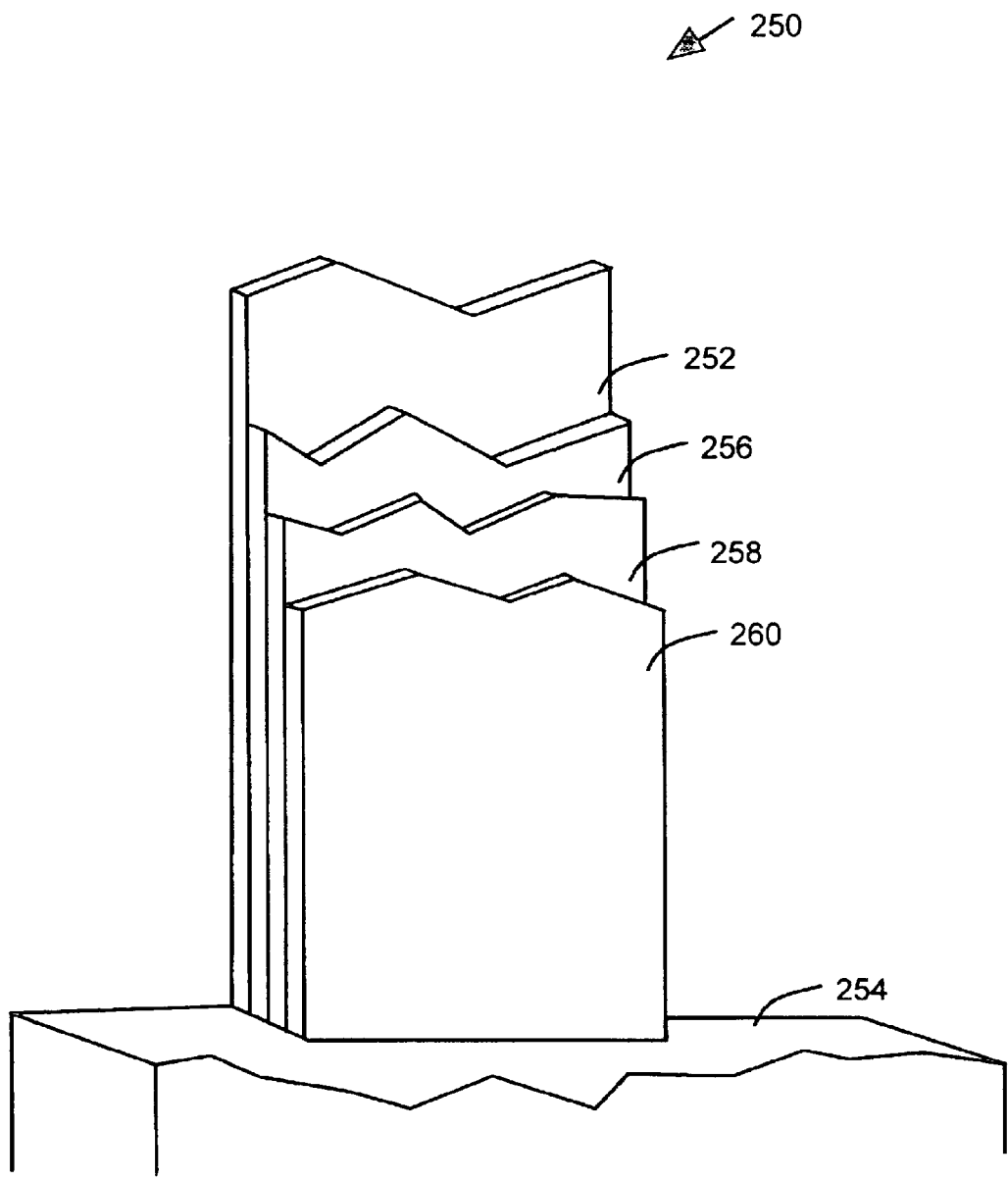
FIG. 3 schematically illustrates a portion of a spin valve transducer.

FIG. 3 schematically illustrates a portion of a spin valve read transducer 250. Spin valve transducer 250 can be included in a magnetoresistive transducer such as the transducer 205 described above in connection with FIG. 2. The spin valve read transducer includes a free layer 252 that comprises nickel-iron and is approximately 100 Angstroms thick. The free layer 252 extends between electrical contacts 254 (only one of which is illustrated in FIG. 3). A spacer layer 256 is stacked adjacent the free layer 252 and is formed by magnetron sputtering of copper to a thickness in the range of 25 Angstroms. The thickness of the spacer layer 256 is carefully controlled to a selected thickness depending on the design parameters of the spin valve read transducer 250. The thickness of the spacer layer 256 is critical to the performance of the giant magnetoresistor (GMR) stack in the spin valve read transducer 250. The copper spacer layer 256 carries a large fraction of the current through the GMR transducer. The thickness of the spacer layer 256 controls coupling strength between the free layer 252 and a pinned layer 258 that is stacked on the spacer layer 256. The pinned layer 258 has a thickness of about 22 Angstroms and comprises cobalt (Co). An exchange layer 260 is stacked adjacent the pinned layer 258 and is formed of iron-manganese (FeMn) to a thickness in the range of 110 Angstroms.

An array of transducers such as the transducer 250 are formed on a wafer, and the thickness of sputtered layers must be uniform across the wafer to ensure good manufacturing yields. Precise control of the thickness of the spacer layer is accomplished with a high manufacturing yield by magnetron sputtering as explained in more detail below in connection with FIGS. 4–8.

Figure 4:
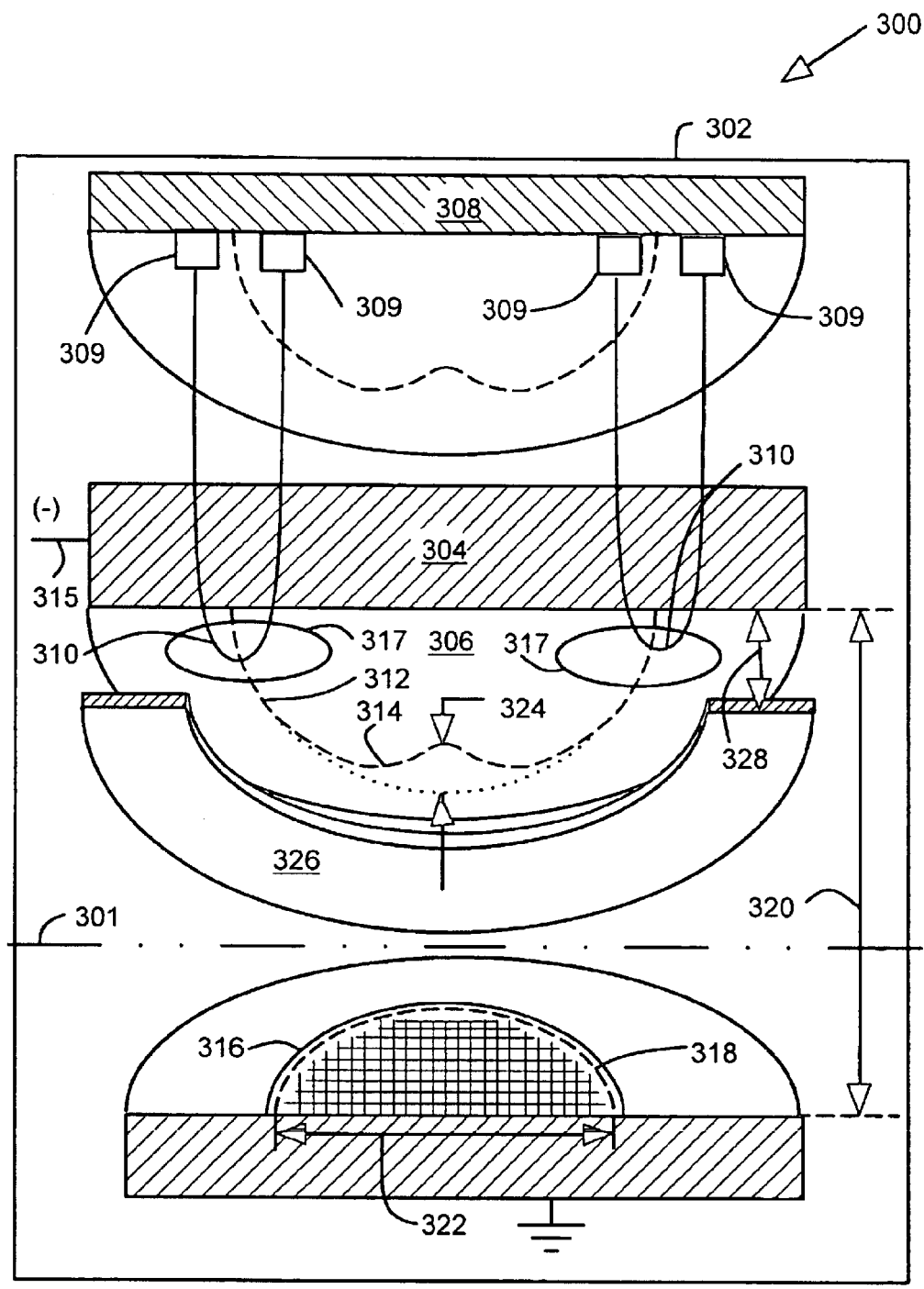
FIG. 4 schematically illustrates a magnetron sputtering chamber.

An apparatus 300 schematically illustrated in FIG. 4 comprises a magnetron sputtering chamber 302. The illustration in FIG. 4 is a partially broken away perspective view with a horizon line at 301.

The sputtering chamber 302 is filled at a low pressure with a sputtering gas such as argon. A sputtering target 304 in the sputtering chamber 302 has a front target surface 306. A magnetron 308 behind the sputtering target 304 provides a magnetic field 310 at the front target surface 306 along a generally round path 312 that includes a path indentation 314. The magnetron 308 is a rotating magnetron that rotates relative to a substrate 316. The magnetron 308 includes a number of pairs of permanent magnets 309 (only 4 of which are illustrated). The sputtering target 304 is connected to an electrical power supply at 315 to generate an electric field in the argon gas inside the sputtering chamber 302. The electric field interacts with the magnetic field 310 to generate an increased activity of argon ions in region 317 adjacent the generally round path 312. The active argon ions along the generally round path 312 collide with the front target surface 306, and atoms of the target material are freed for sputtering on nearby surfaces inside the sputtering chamber 302.

The substrate 316 is aligned with a central region 318 in front of the front target surface 306 and spaced apart from the front target surface 306 by a selected spacing 320. The central region 318 has a diameter 322 defined by a uniformly sputtered thickness of sputtered layers that form on the substrate 316.

The standard process adjustments that are found in the sputtering chamber 302 are not able to provide improvements to sputtering thickness uniformity needed to increase manufacturing yields of magnetoresistive transducers. The sputtering chamber 302 has a knob that adjusts the source-to-substrate distance (selected distance 320), however, the knob can only adjust the selected distance 320 down to about 2 inches due to mechanical interference between a shutter 326 and wafer 316. Uniformity typically improves as selected distance 320 is reduced, but non-uniformity is still at 6–8% at the closest available selected spacing 320.

By experimentation, it is found that there is an optimal value ("sweet spot") for selected distance 320 that is less than 2 inches. This optimal value is behind the shutter 326 and not practically available for use in sputtering thin films on a wafer substrate. It is also found by experimentation, that the optimal distance is surprisingly sensitive to the path indentation depth 324. As illustrated, the path indentation depth is a central distance between the path indentation 314 and a circle defined by the round portion of the path 312. In one embodiment, the path indentation depth is decreased by only 8 millimeters, and the optimum value of the selected distance 320 shifts out to 2.25 inches. The selected distance 320 of 2.25 inches is then past the shield 326 and is practically available for use in sputtering thin films on wafer substrate 316. The path indentation 314 is adjusted or set to a path indentation depth 324 that maximizes the diameter 322 at the selected spacing 320. With this increased path indentation depth 324, the shutter 326 is spaced apart from the front target surface 306 by a shutter spacing 328, and the selected spacing 320 is greater than the shutter spacing 328.

Mechanical interference between the shutter 326 and the wafer 316 is avoided and non-uniformities on the order of 2.4% or less can be achieved across the diameter 322 of the central region 318.

The sputtering chamber 302, with a copper sputtering target 304 and with an adjusted path indentation depth 324 can be used to deposit the copper spacer layer 256 described above in connection with FIG. 3. With the adjustment of the path indentation depth, the uniformity of the copper deposition is not as limited by the magnetron design constraints. It is found that a uniformly sputtered thickness of copper on the wafer 316 can be controlled to vary by less than 2.4% in a manufacturing environment. High manufacturing yields of magnetoresistors are achieved.

The sputtering chamber 302, with its adjusted path indentation depth 324 can be used to deposit other thin film materials used in thin film heads such as Platinum-Manganese (PtMn) alloy, Iron-Nickel-Chromium (FeNiCr) alloy, or Ruthenium (Ru). Substrates 316 that include magnetoresistors with deposited layers, such as spin valve transducers, can be manufactured with high manufacturing yields because of the precise thickness control achievable with the adjusted path indentation depth 324 set to an experimentally observed optimum setting, also called a "sweet spot." The historical problem of non-uniformity of sputtered layer thicknesses on the order of 6–8% is avoided. The non-uniformity due to erosion groove formation at the target surface 306 is also found to be reduced, and targets 304 can be used longer before being replaced. The adjustment of the path indentation depth 324 is explained in more detail below in connection with FIGS. 5–6.

Figure 5:
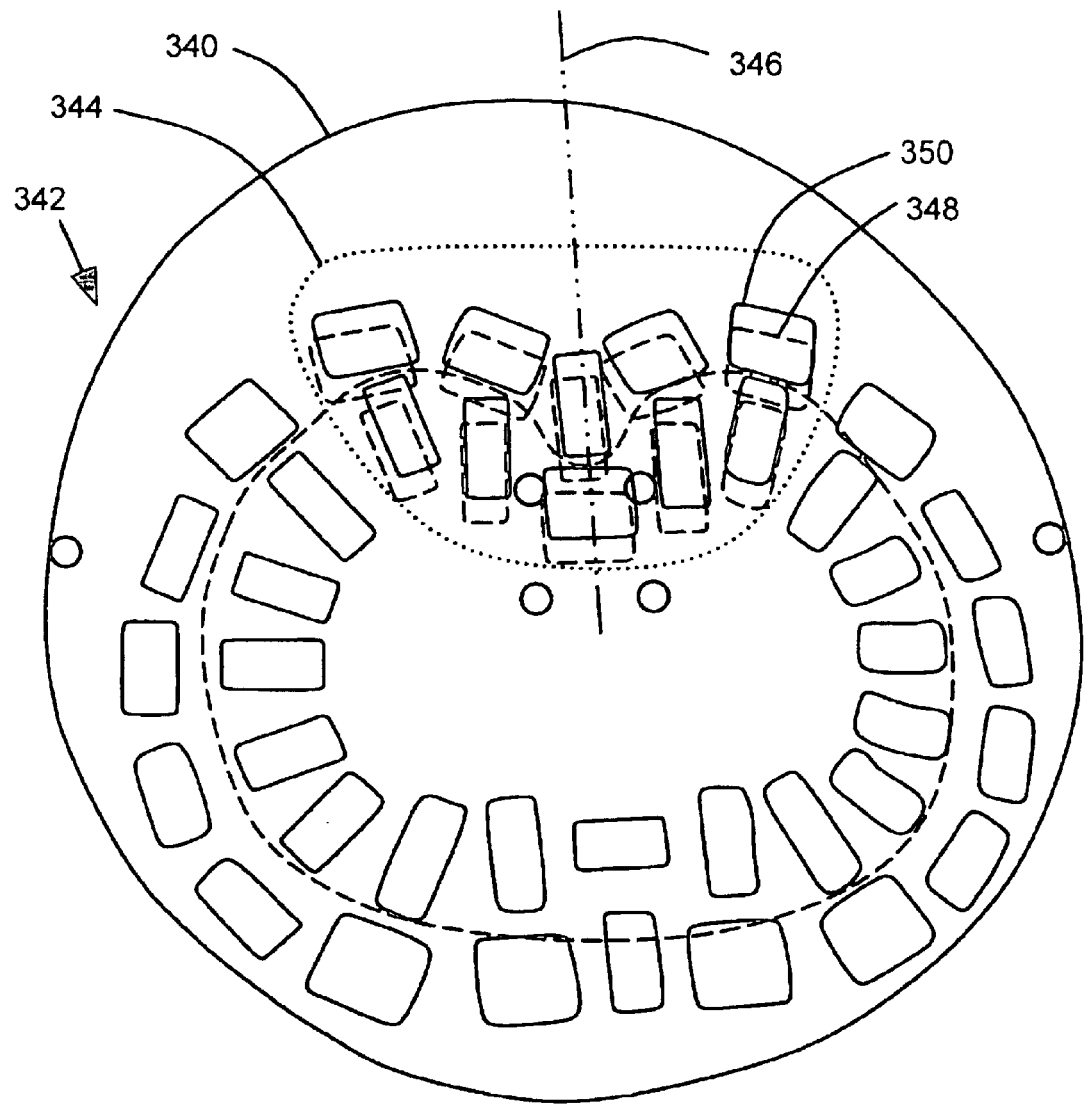
FIG. 5 schematically illustrates a magnetron for a magnetron sputtering chamber.

FIG. 5 schematically illustrates an oblique view of a magnetron 340 for use in a magnetron sputtering chamber such as magnetron sputtering chamber 302 in FIG. 4. A first array of magnets 342 are secured on the magnetron 340 in conventional positions. A second array of magnets 344 around a path indention line 346, however have been moved along the axis or line 346 from conventional positions indicated by dashed lines 348 to locations 350 indicated by solid lines. The movement of the magnets 344 results in a change in the path indentation depth 324 at the target surface 306 (FIG. 4). The path indentation depth 324 is set by setting positions of the group (array) of the magnets 344 that are aligned with the path indentation along line 346.

Approximately five to seven magnet pairs are moved radially outward 8 mm. This moves the "sweet spot" of deposition to a usable spacing 320 (about 2.25 inches) and improves copper deposition non-uniformity to about 2.4% or less. A small and inexpensive modification to the magnetron 340 and a small corresponding adjustment to the spacing 320 results in a significant process improvement.

The process of optimizing the magnetron shape is experimental and dependent upon parameters such as the target material. For example, an optimum shape for PtMn, NiFeCr or Ru targets use slightly different modifications to the shape in comparison to the Cu targets.

Figure 6:
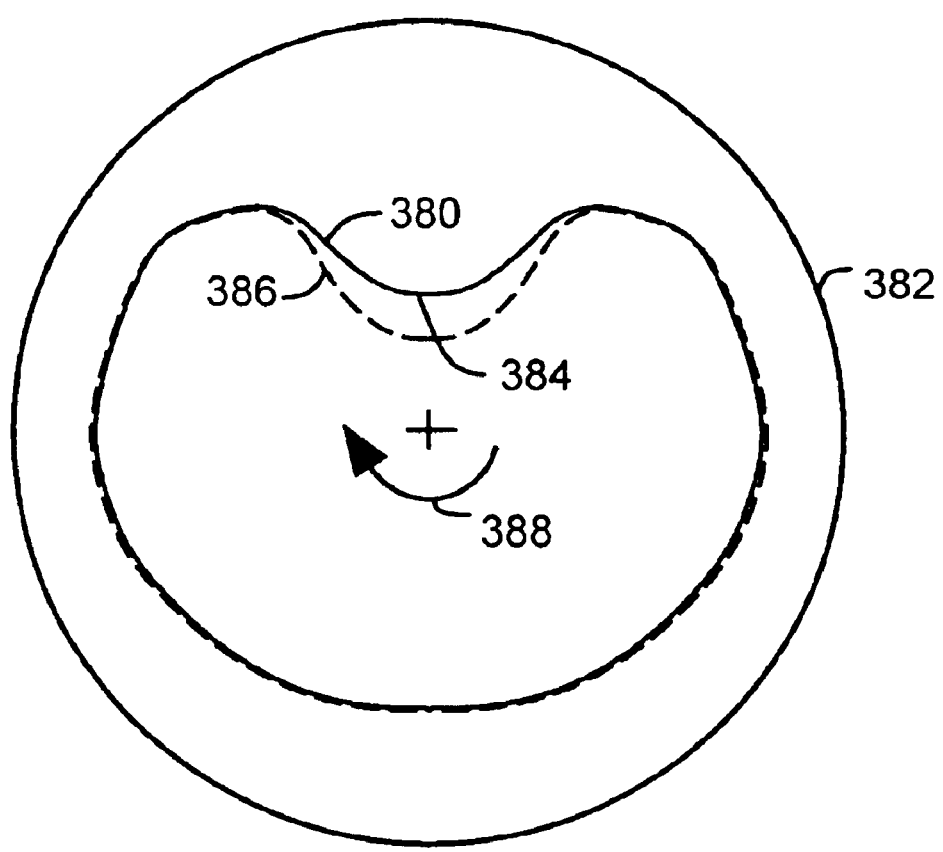
FIG. 6 schematically illustrates a magnetron racetrack.

FIG. 6 schematically illustrates a magnetron racetrack 380 on a sputtering target 382. The racetrack 380 is a pattern defined by a region where the magnetron's magnetic field intersects with an electric field in front of a sputtering target. The racetrack 380 is generally visible on the sputtering target 380 as an eroded path after the sputtering target has been in use for some time. The racetrack 380 is a generally round or circular path that includes a path indentation 384 that is adjusted. The path indentation 384 has been adjusted, as illustrated, outwardly away from a convention path indentation indicated by dashed line 386. A direction of relative rotation of the sputtering target 382 is illustrated by an arrow 388.

Figure 7:
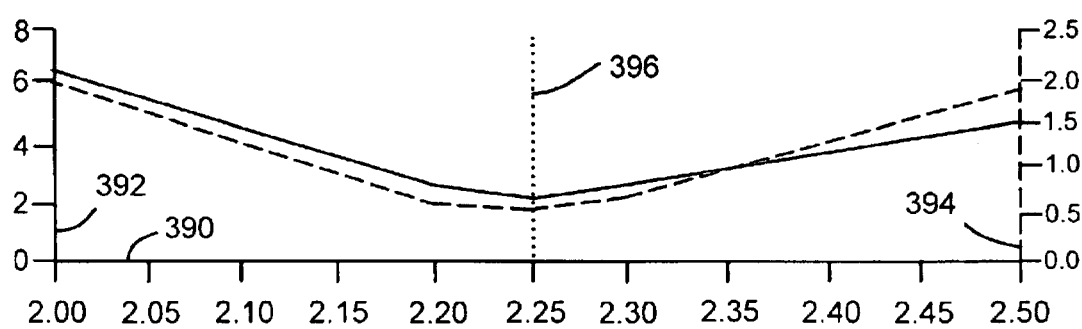
FIG. 7 illustrates a graph of sputtered thin film thickness and variation of the sputtered thin film thickness.

FIG. 7 illustrates a graph of sputtered thin film thickness non-uniformity and variation of the sputtered thin film thickness. FIG. 7 has a horizontal axis 390 that represents distances between the a front target surface and a substrate. FIG. 7 includes a first (solid line) vertical axis 392 that represents percentage non-uniformity of sputtered film thickness across a central region on the substrate. FIG. 7 also includes a second (dashed line) vertical axis 394 that indicates manufacturing standard deviation (sigma) of sputtered film thickness on the substrate. As can be seen by inspection of FIG. 7, a "sweet spot" is located at 396, a spacing of approximately 2.25 inches, where both sigma and the non-uniformity of thickness across the central region are optimized.

Figure 8:
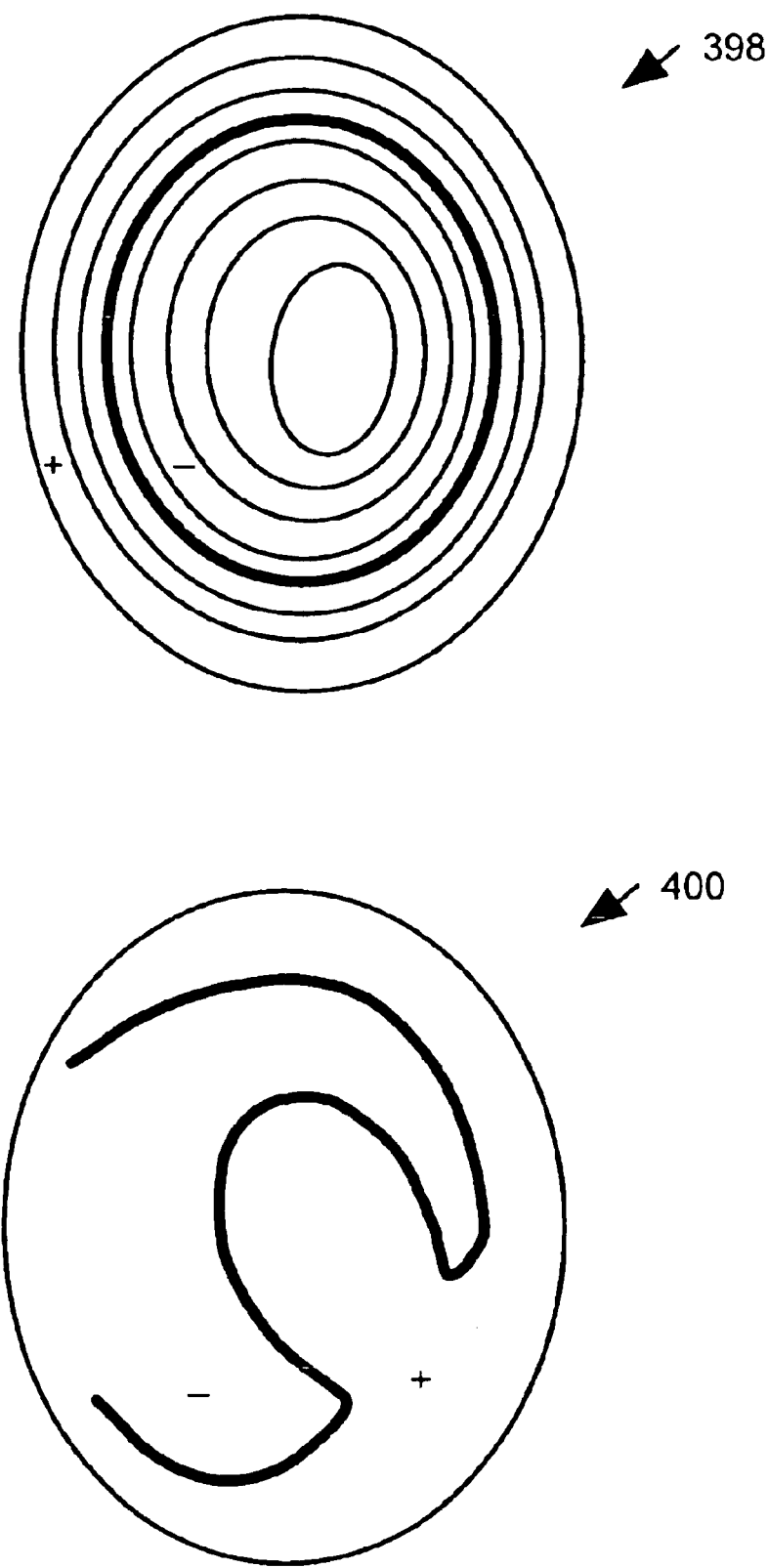
FIG. 8 schematically illustrates oblique views of isobars of sputter film thickness over a wafer surface.

FIG. 8 schematically illustrates isobars of sputter film thickness at a spacing of 2.25 inches from a front target surface. The pattern at 398 results from use of a conventional magnetron with a conventional path indentation depth, shows closely spaced isobars of sputter film thickness. The close spacing of the isobars in the pattern at 398 indicate relatively large variations in sputter film thickness. The pattern at 400 results from use of a magnetron with a shallower, experimentally adjusted, path indentation depth, and shows only a single isobar. The relatively wide spacing of the isobars in the pattern at 400 indicate relatively small variations in sputter film thickness.

In summary, an apparatus (300) comprises a sputtering chamber (302) that includes a sputtering target (304) with a front target surface (306), and a magnetron (308) behind the sputtering target (304). The magnetron (308) provides a magnetic field (310) at the front target surface (306) along a generally round path (312) that includes a path indentation (314).

A shutter (326) is spaced apart from the front target surface (306) by a shutter spacing (328). A substrate (316) is aligned with a central region (318) in front of the front target surface (306) and spaced apart from the front target surface (306) by a selected spacing (320) that is greater than the shutter spacing (328). The central region (318) has a diameter (322) defined by a uniformly sputtered thickness of deposited layers (256) on the substrate (318).

The path indentation (314) is set to a path indentation depth (324) that adjusts the selected spacing (320) to maximize the diameter (322).

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the read/write head while maintaining substantially the same functionality without departing from the scope and spirit of the present invention. For example, the magnetron magnets may be electromagnets, permanent magnets or a combination of permanent magnets and electromagnets. In addition, although the preferred embodiment described herein is directed to physically moving magnets of the magnetron, it will be appreciated by those skilled in the art that the magnetic field shape can be adjusted by adjusting current magnitudes in an array of coils. The teachings of the present invention can be applied to other magnetic systems, like tape drives, without departing from the scope and spirit of the present invention.

What is claimed is:

1. An apparatus, comprising:
   a sputtering chamber including a sputtering target with a front target surface, and a magnetron behind the sputtering target that provides a magnetic field at the front target surface along a generally round path that includes a path indentation;
   a shutter spaced apart from the front target surface by a shutter spacing;
   a substrate aligned with a substrate central region in front of the front target surface and spaced apart from the front target surface by a selected spacing that is greater than the shutter spacing;
   deposited layers on the substrate;
   the substrate central region having a diameter defined by a selected uniformity of a sputtered thickness of the deposited layers on the substrate; and
   the path indentation being set to a path indentation depth and the selected spacing being set to an optimum value to maximize the diameter for the selected uniformity of the sputtered thickness.

2. The apparatus of claim 1 wherein the magnetron is a rotating magnetron that rotates relative to the substrate.

3. The apparatus of claim 1 wherein the sputtering target comprises copper.

4. The apparatus of claim 1 wherein the sputtering target comprises a material selected from the group consisting of Platinum-Manganese (PtMn) alloy, Iron-Nickel-Chromium (FeNiCr) alloy, and Ruthenium (Ru).

5. The apparatus of claim 1 wherein the uniformly sputtered thickness varies by less than 2.4%.

6. The apparatus of claim 1 wherein the magnetron comprises an array of magnets and the path indentation depth is set by setting positions of a group of the magnets that are aligned with the path indentation.

7. The apparatus of claim 1 wherein the substrate includes magnetoresistors including the deposited layers.

8. The apparatus of claim 1 wherein the deposited layers are spacer layers in spin valve transducers.

9. A method of providing a sputtered thin film with a uniform thickness, comprising:
   providing a sputtering chamber including a sputtering target with a front target surface;
   providing a magnetic field at the front target surface along a generally round path that includes a path indentation by positioning a magnetron behind the sputtering target;
   providing a shutter spaced apart from the front target surface by a shutter spacing;
   aligning a substrate with a substrate central region in front of the front target surface and spaced apart from the front target surface by a selected spacing that is greater than the shutter spacing; the central region having a diameter defined by a selected uniformity of sputtered thickness of a deposited layers on the substrate; and
   setting the path indentation to a path indentation depth and setting the selected spacing to an optimum value to maximize the diameter for the selected uniformity of sputtered thickness.

10. The method of claim 9 wherein the setting the path indentation comprises:
   setting positions of a group of magnets that are aligned with the path indentation.

11. The method of claim 9 further comprising:
   rotating the magnetron relative to the substrate.

12. The method of claim 9 further comprising:
   forming the sputtering target from a material comprising copper.

13. The method of claim 9 further comprising:
   forming the sputtering target from a material selected from the group consisting of Platinum-Manganese (PtMn) alloy, Iron-Nickel-Chromium (FeNiCr) alloy, and Ruthenium (Ru).

14. The method of claim 9 further comprising:
   controlling the uniformly sputtered thickness to variations of less than 2.4%.

15. The method of claim 9 wherein the substrate include an array of magnetoresistors including the deposited layers.

16. The method of claim 9 wherein the deposited layers are spacer layers in spin valve transducers.

17. An apparatus, comprising:
   a sputtering chamber including a sputtering target with a front target surface, and a magnetron behind the sputtering target that provides a magnetic field at the front target surface along a generally round path that includes a path indentation;
   a shutter spaced apart from the front target surface by a shutter spacing;
   a substrate aligned with a substrate central region in front of the front target surface and spaced apart from the front target surface by a selected spacing that is greater than the shutter spacing; the substrate central region having a diameter defined by a selected uniformity of a sputtered thickness of a deposited layers on the substrate; and
   means for setting the path indentation to a path indentation depth and for setting the selected spacing to an optimum value to maximize the diameter for the selected uniformity of sputtered thickness.

* * * * *